(12) United States Patent
Zhang

(10) Patent No.: US 11,150,701 B1
(45) Date of Patent: Oct. 19, 2021

(54) CASE FOR A COMPUTING DEVICE

(71) Applicant: iBenzer Inc., College Point, NY (US)

(72) Inventor: Lina Zhang, Bayside Hills, NY (US)

(73) Assignee: iBenzer Inc., College Point, NY (US)

( * ) Notice: Subject to any disclaimer, the term of this patent is extended or adjusted under 35 U.S.C. 154(b) by 0 days.

(21) Appl. No.: 17/222,980

(22) Filed: Apr. 5, 2021

(51) Int. Cl.
*G06F 1/16* (2006.01)
*H05K 5/02* (2006.01)

(52) U.S. Cl.
CPC .......... *G06F 1/1656* (2013.01); *G06F 1/1628* (2013.01); *G06F 1/1679* (2013.01); *H05K 5/0221* (2013.01); *G06F 2200/1634* (2013.01)

(58) Field of Classification Search
CPC ................. G06F 1/1628; G06F 1/1656; A45C 2011/002; A45C 2011/003; H04M 1/0283
See application file for complete search history.

(56) References Cited

U.S. PATENT DOCUMENTS

| | | | | |
|---|---|---|---|---|
| 5,002,184 A * | 3/1991 | Lloyd | ................... | A45C 11/24 |
| | | | | 206/305 |
| 5,583,742 A * | 12/1996 | Noda | ................... | H01M 50/30 |
| | | | | 361/679.21 |
| 6,532,152 B1 * | 3/2003 | White | ............... | G02F 1/133308 |
| | | | | 361/692 |
| 7,515,947 B2 * | 4/2009 | Lee | ................... | H04M 1/0214 |
| | | | | 455/566 |
| 7,965,500 B1 * | 6/2011 | Bruce | .................. | G06F 1/1656 |
| | | | | 361/679.34 |
| 8,245,842 B2 * | 8/2012 | Bau | ........................ | B65D 85/00 |
| | | | | 206/320 |
| D670,279 S * | 11/2012 | Veltz | ............................ | D14/250 |
| D671,932 S * | 12/2012 | Azoulay | ...................... | D14/250 |
| 8,342,325 B2 * | 1/2013 | Rayner | .................. | A45C 11/00 |
| | | | | 206/320 |
| 8,355,250 B2 | 1/2013 | Yu | | |
| D682,816 S * | 5/2013 | Fathollahi | .................... | D14/250 |
| D685,358 S * | 7/2013 | Armstrong | ................... | D14/250 |
| 8,544,644 B2 * | 10/2013 | Meehan | ............... | G06F 1/1628 |
| | | | | 206/320 |
| 8,576,562 B2 | 11/2013 | Schwager et al. | | |
| 8,584,847 B2 * | 11/2013 | Tages | ................... | H04B 1/3888 |
| | | | | 206/320 |
| 8,699,233 B2 | 4/2014 | Palm et al. | | |
| 9,141,136 B2 | 9/2015 | Shulenberger | | |
| 9,241,053 B2 * | 1/2016 | Ashley | .................... | H04M 1/04 |
| 9,545,140 B1 * | 1/2017 | Johnson | ................. | A45C 11/00 |
| 9,559,739 B2 * | 1/2017 | Murphy | ............... | G06F 1/1656 |
| D789,937 S * | 6/2017 | Zhang | .......................... | D14/440 |
| D790,552 S * | 6/2017 | Zhang | .......................... | D14/440 |
| D792,412 S * | 7/2017 | Zhang | .......................... | D14/440 |
| D792,885 S * | 7/2017 | Zhang | .......................... | D14/440 |
| D792,887 S * | 7/2017 | Zhang | .......................... | D14/440 |

(Continued)

*Primary Examiner* — Adrian S Wilson
(74) *Attorney, Agent, or Firm* — iPA & iPM

(57) ABSTRACT

The present disclosure is for a layered protective case for a computing device with a latch mechanism. The protective case comprises a first protective rim fitted with a first shell layer to capture a first body of the computing device; a second protective rim fitted with a second shell layer to capture a second body of the computing device; and a latch mechanism to secure or to release the movable/foldable portion of the device as needed. Various embodiments are discussed to illustrate options of trade offs among functionality and several desired features.

11 Claims, 11 Drawing Sheets

(56) References Cited

U.S. PATENT DOCUMENTS

| | | | | |
|---|---|---|---|---|
| D795,839 S | * | 8/2017 | Zhang | D14/217 |
| 9,785,204 B1 | * | 10/2017 | Miller | H04M 1/04 |
| 9,851,745 B2 | | 12/2017 | Lev et al. | |
| 10,051,934 B1 | * | 8/2018 | Zhang | A45C 11/00 |
| 2002/0137475 A1 | * | 9/2002 | Shou | H04B 1/3838 |
| | | | | 455/575.8 |
| 2003/0095374 A1 | * | 5/2003 | Richardson | G06F 1/1626 |
| | | | | 361/679.3 |
| 2004/0025993 A1 | * | 2/2004 | Russell | G06F 1/1613 |
| | | | | 150/154 |
| 2007/0227923 A1 | * | 10/2007 | Kidakarn | G06F 1/1681 |
| | | | | 206/320 |
| 2008/0308437 A1 | * | 12/2008 | Lin | G06F 1/1616 |
| | | | | 206/320 |
| 2012/0118773 A1 | * | 5/2012 | Rayner | H05K 5/0004 |
| | | | | 206/320 |
| 2012/0217257 A1 | * | 8/2012 | Ting | G06F 1/1628 |
| | | | | 220/660 |
| 2013/0027862 A1 | * | 1/2013 | Rayner | H01H 13/06 |
| | | | | 361/679.3 |
| 2018/0213901 A1 | * | 8/2018 | Zhang | A45C 11/00 |

\* cited by examiner

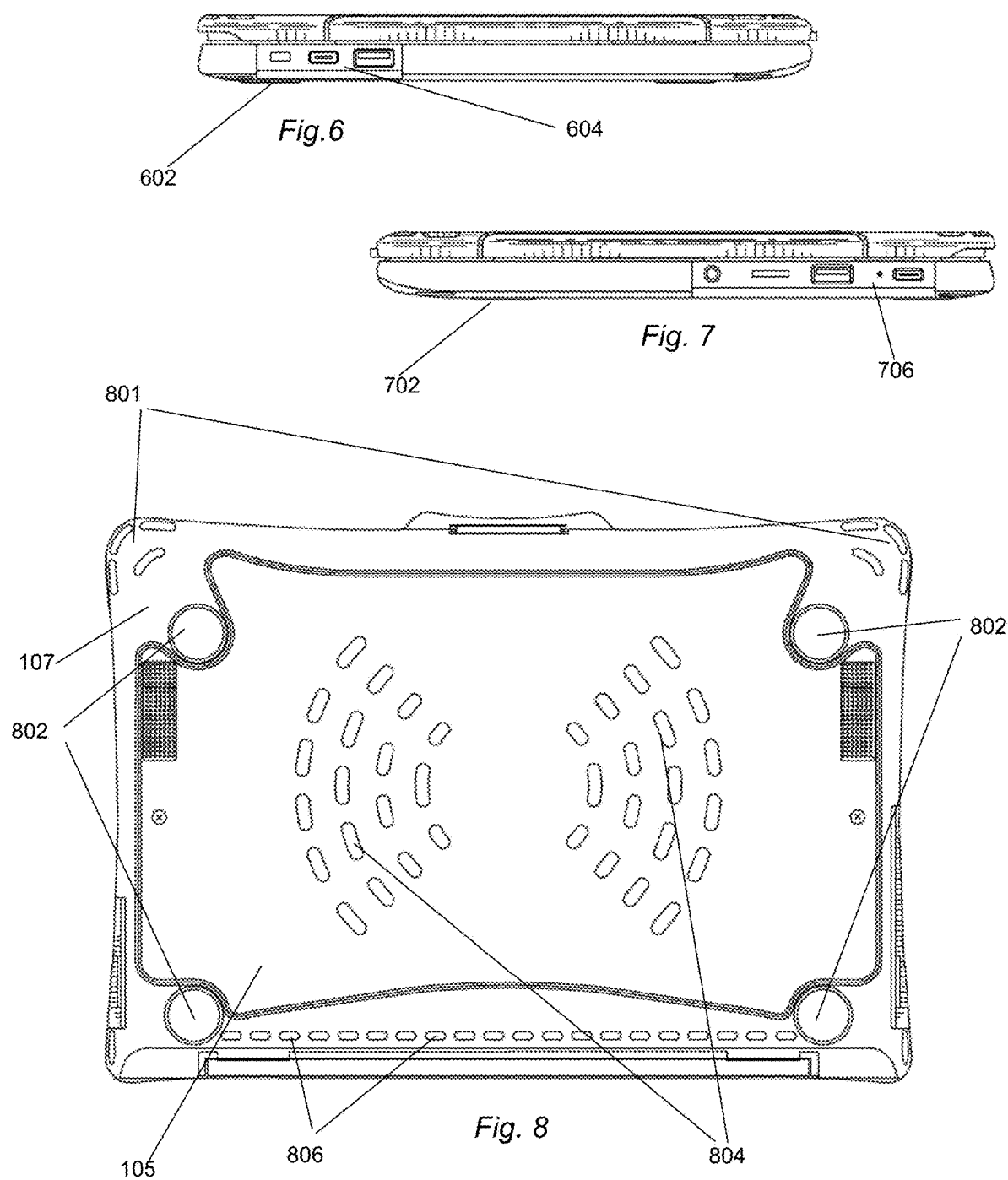

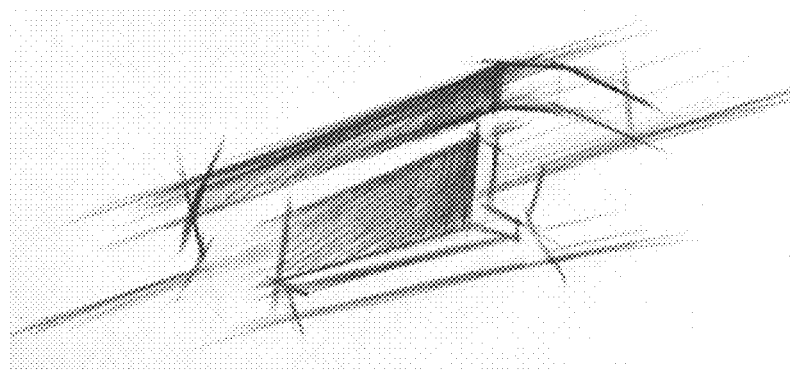
*Fig. 21.a*
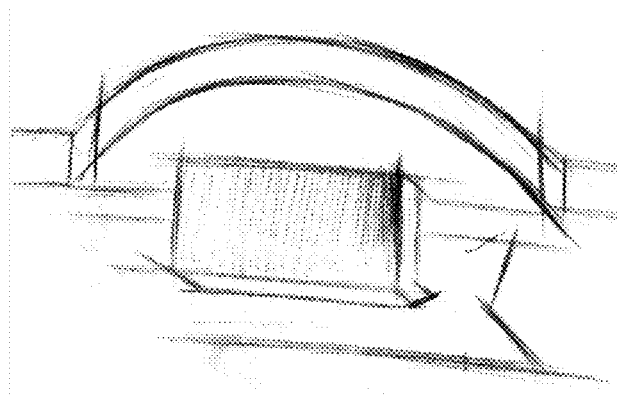
*Fig. 21.b*
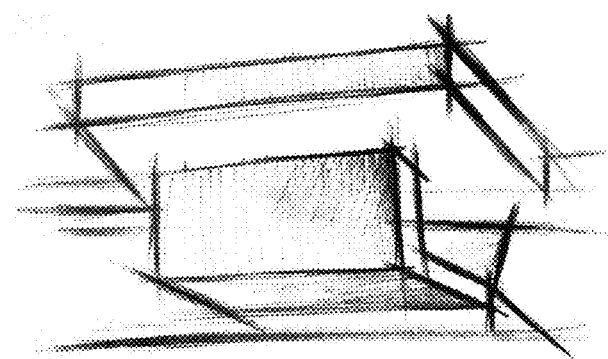
*Fig. 21.c*

CASE FOR A COMPUTING DEVICE

CROSS-REFERENCES TO RELATED APPLICATIONS

U.S. Design patent application Ser. No. 29/747,251 and Ser. No. 29/747,254 were both filed on Aug. 20, 2020, with an outside view of one of the embodiments among the present disclosure. These two design applications are currently pending examination at the USPTO, and have not been published as of the filing date of the present utility application.

TECHNICAL FIELD

The present disclosure relates to a protective case for portable computing devices. More specifically, the present specification discloses a case with a latch mechanism to secure or to release movable/foldable parts of laptop computers, tablets, phones, or electronic devices with similar functionality.

BACKGROUND OF THE DISCLOSURE

Computing devices such as laptops, phones, and tablets are becoming more and more portable. They strive to be lighter and thinner than ever, yet to have more powerful computing capacity and speed than their predecessors. One option to improve portability is to fold a device, even its screen, in a bid to make it more compact by reducing its size. These types of devices are still relatively expensive, and therefore require protection even when they are handled with care. The present disclosure supports a case for this very purpose, taking into consideration the ease of locking and releasing, force and pattern of impact, as well as the need of heat dissipation.

BRIEF SUMMARY OF EMBODIMENTS OF THE DISCLOSURE

The present disclosure relates to a protective case for portable computing devices. More specifically, the present specification discloses a case with a latch mechanism to secure or to release movable/foldable parts of laptop computers, tablets, phones, or electronic devices with similar functionality.

In a variant, the protective case for a portable computing device comprises a first protective rim configured to enclose and to capture at least a portion of a first body and its perimeter of the computing device, wherein the first protective rim further encloses a first shell layer covering a top surface of the first body; a second protective rim configured to enclose and to capture at least a portion of a second body and its perimeter of the computing device, wherein the second protective rim further encloses a second shell layer covering a bottom surface of the second body; and a latch mechanism comprising a flat lip, extending directly outward from a front edge of the first protective rim, and a latch body with a footed end affixed to an inferior surface of the flat lip extending downward, wherein a tip portion of the footed end is snapped in to or out of a receiving slot situated at a corresponding location along the second protective rim.

In another variant, all corners of the first and second protective rims further comprise groups of cutouts in a preset formation.

In yet another variant, the second protective rim further comprises foot elements to raise the computing device above its resting surface.

In still another variant, the second shell layer and the second protective rim further comprises groups of slits to facilitate heat dissipation.

In a variant, the second protective rim further comprises opened spaces along its sides to accommodate hardware and accessories.

In another variant, the flat lip of the latch mechanism is substantially parallel to a top surface of the computing device.

In yet another variant, the flat lip of the latch mechanism comprises a width and depth greater than that of the latch body by a preset amount.

In still another variant, the latch body and its footed end of the latch mechanism comprise a hook shaped profile.

In a variant, the flat lip of the latch mechanism is generally perpendicular to the latch body.

In another variant, the receiving slot of the latch mechanism further comprises a receiving slit with a width equal to or longer than that of a width of the footed end.

In still another variant, the first and second shell layers comprises a pre-set transparency number between 0-100.

Other features and aspects of the disclosure will become apparent from the following detailed description, taken in conjunction with the accompanying drawings, which illustrate, by way of example, the features in accordance with embodiments of the disclosure. The summary is not intended to limit the scope of the disclosure, which is defined solely by the claims attached hereto.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments of the disclosure. These drawings are provided to facilitate the reader's understanding of the disclosure and shall not be considered limiting of the breadth, scope, or applicability of the disclosure. It should be noted that for clarity and ease of illustration these drawings are not necessarily made to scale.

Some of the figures included herein illustrate various embodiments of the disclosure from different viewing angles. Although the accompanying descriptive text may refer to such views as "top," "bottom" or "side" views, such references are merely descriptive and do not imply or require that the disclosure be implemented or used in a particular spatial orientation unless explicitly stated otherwise.

FIG. 6 is a left side view thereof.

FIG. 7 is a right side view thereof.

FIG. 8 is a bottom view thereof.

FIGS. 21a-c illustrates sketching of the latch mechanism in various shapes and formations according to some embodiments of the present disclosure.

The figures are not intended to be exhaustive or to limit the disclosure to the precise form disclosed. It should be understood that the disclosure can be practiced with modification and alteration, and that the disclosure be limited only by the claims and the equivalents thereof.

DETAILED DESCRIPTION OF THE EMBODIMENTS OF THE DISCLOSURE

From time-to-time, the present disclosure is described herein in terms of example environments. Description in terms of these environments is provided to allow the various features and embodiments of the disclosure to be portrayed in the context of an exemplary application. After reading this description, it will become apparent to one of ordinary skill in the art how the disclosure can be implemented in different and alternative environments.

Unless defined otherwise, all technical and scientific terms used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this document prevails over the definition that is incorporated herein by reference.

Figure 1:
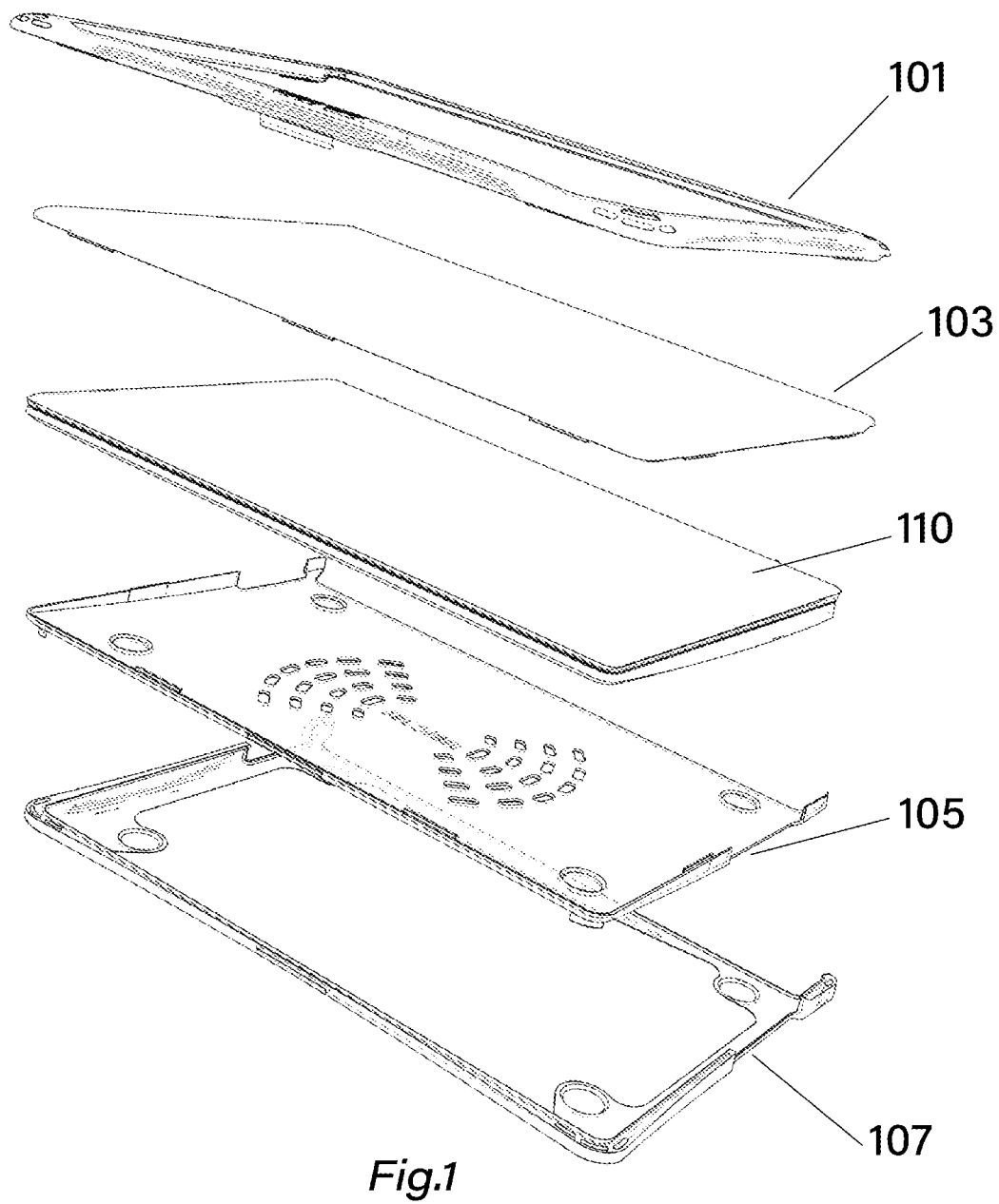
FIG. 1 is an illustration of a case for a laptop comprising multiple layers according to some embodiments of the present disclosure.
Figure 2:
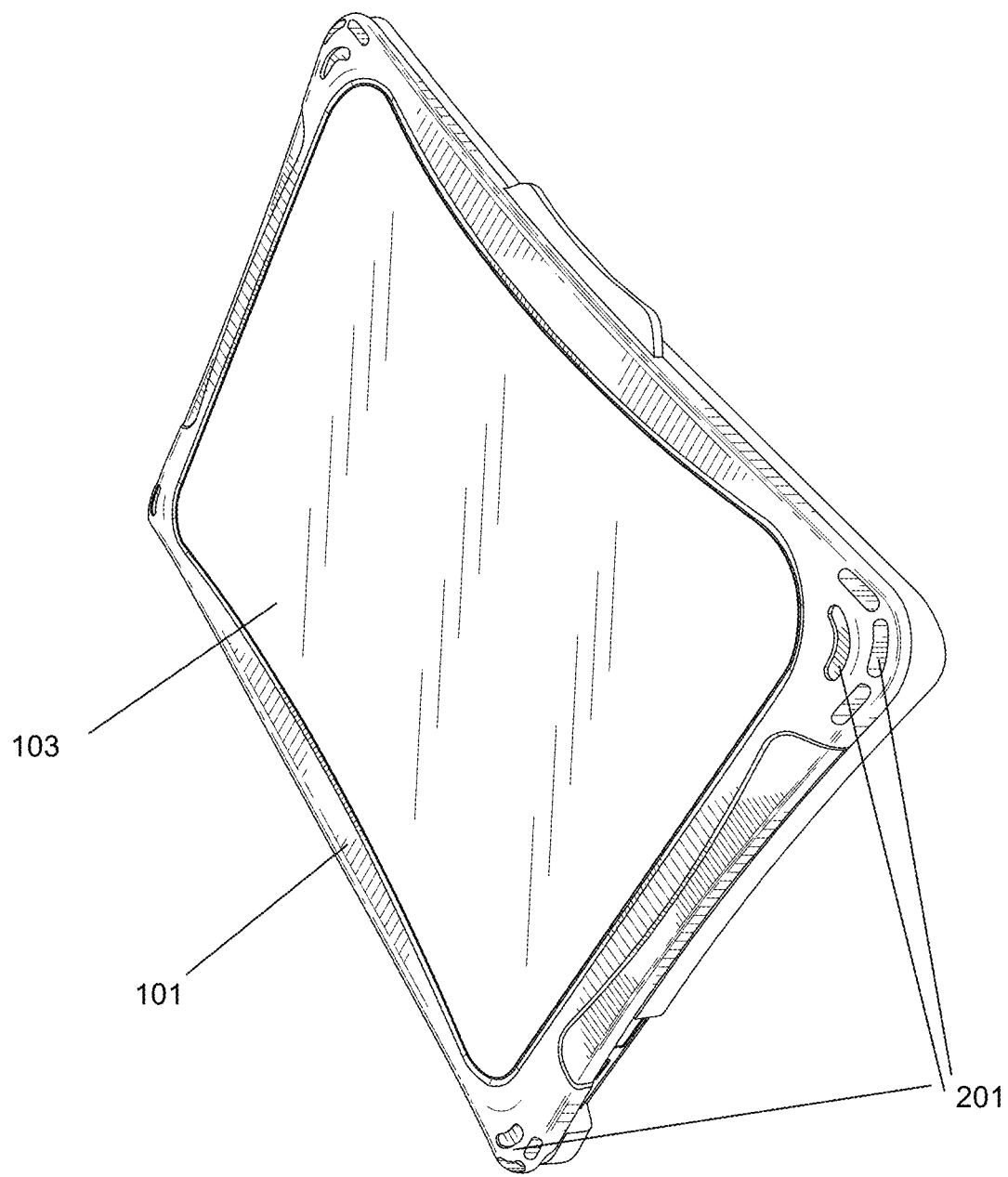
FIG. 2 is a schematic line drawing of a perspective view from above of a case fitted onto a device.
Figure 3:
FIG. 3 is a front view thereof.
Figure 4:
FIG. 4 is a back view thereof.
Figure 5:
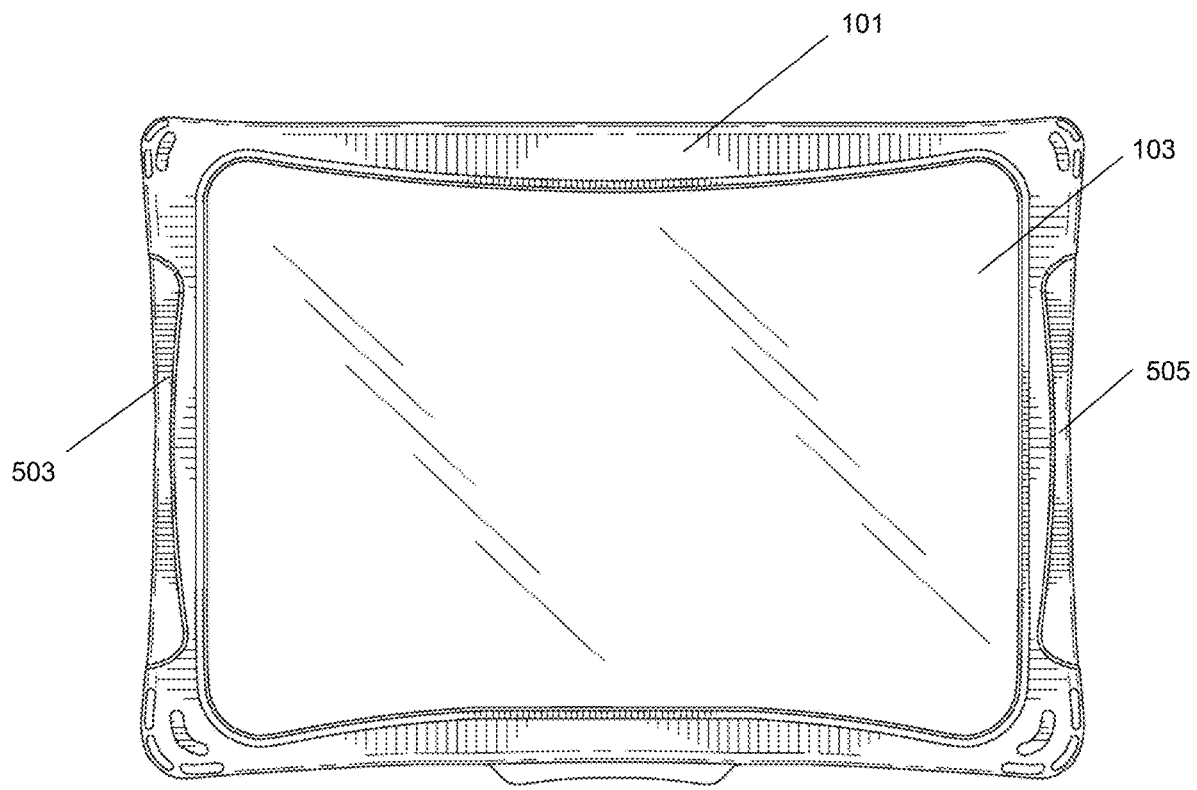
FIG. 5 is a top view thereof.
Figure 9:
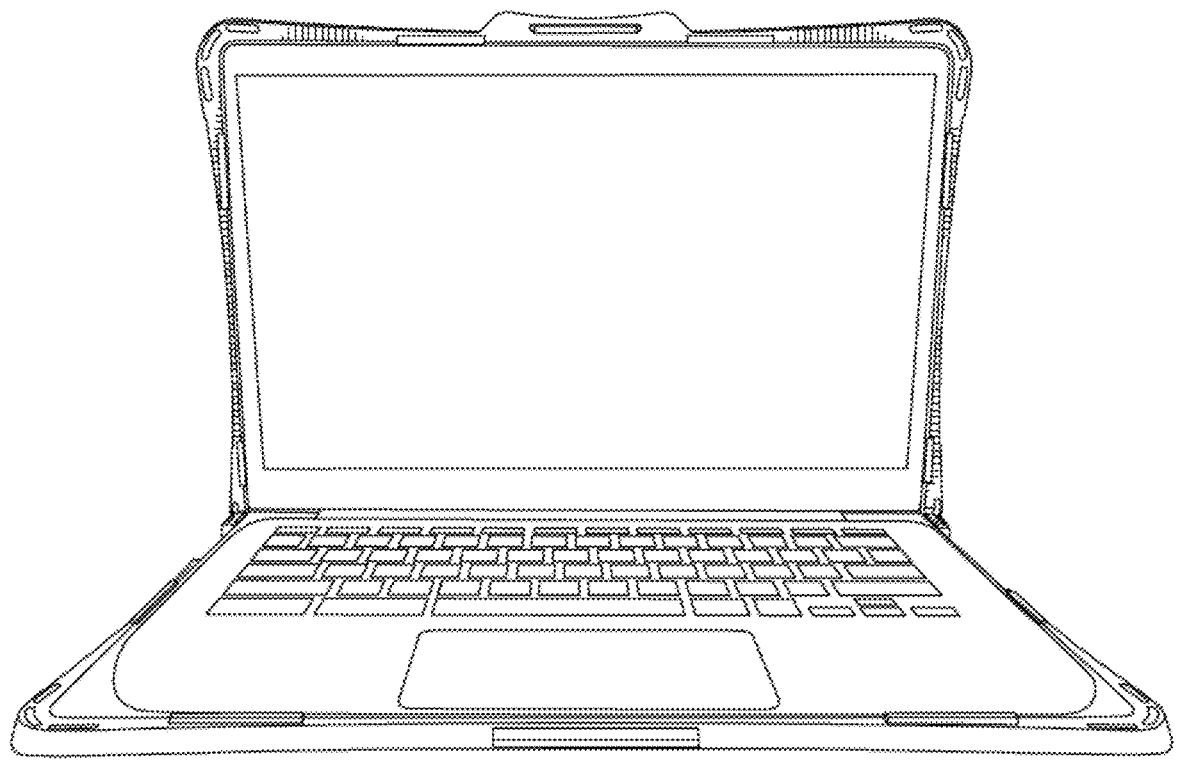
FIG. 9 is a schematic illustration of a front view of a laptop in an opened position while fitted with a case.

FIG. 1 is an illustration of a protective case for a laptop comprising multiple layers according to some embodiments of the present disclosure. The protective case comprises mainly four layers, a first protective rim 101, a first shell 103, a second shell layer 105, and a second protective rim 107. A laptop 110 is positioned as an example between layers 103 and 105. When the protective case is assembled, first rim 101 and shell layer 103 are fitted snuggly together. They largely cover the top surface of the laptop and engage the top panel of the laptop around its corners and perimeters. Shell layer 105 and rim 107 are fitted snuggly together to partially cover the bottom surface of the laptop and to engage the bottom panel around its corners and perimeters.

Figure 10:
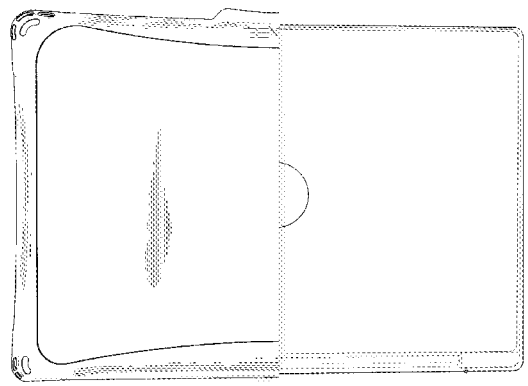
FIG. 10 is top view of a comparison between a device fitted with a case and without.
Figure 11:
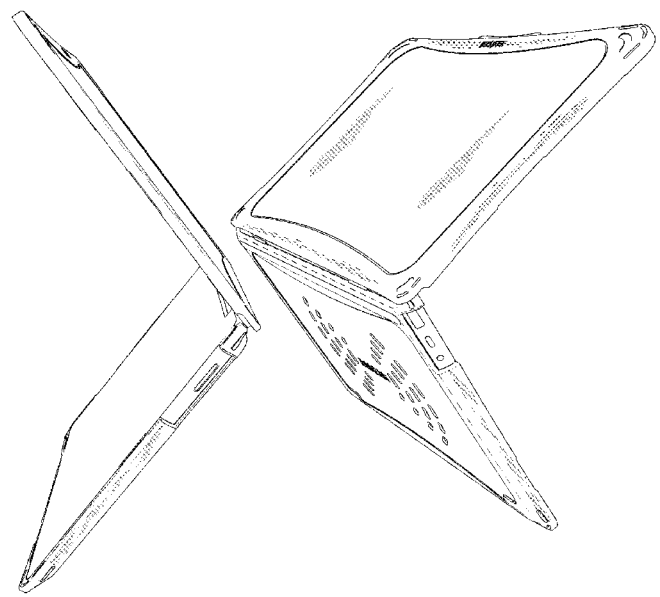
FIG. 11 is a comparison of perspective views, one from the front and one from the back, of a device fitted with a case and in an opened position.
Figure 12:
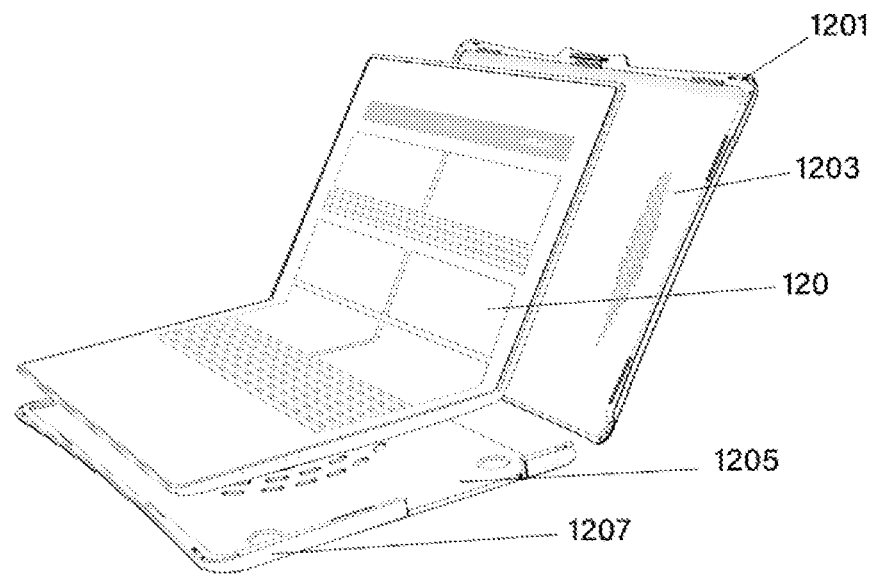
FIG. 12 is an illustration of a foldable tablet fitted with a case.
Figure 13:
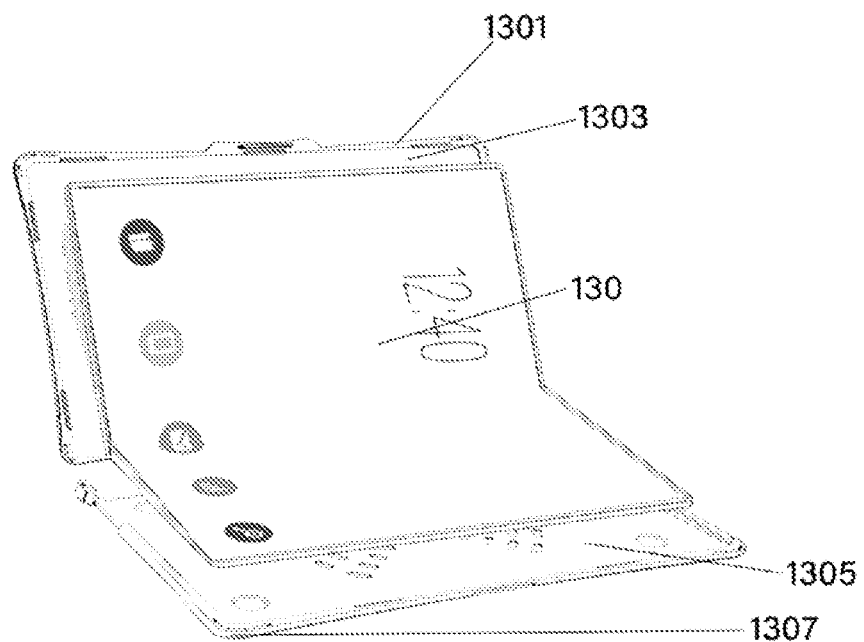
FIG. 13 is an illustration of a foldable phone fitted with a case.

FIGS. 10 and 11 show several different views of a laptop fitted with a protective case. FIG. 10 is top view of a comparison between a device fitted with a case and without. The transparency of the first or the second shell layers 103 and 105 can be adjusted or preset to any value between completely transparent to completely opaque. These layers portrayed in FIGS. 1, 12, and 13 are quite transparent so as to assist better visualization of the structure of the case.

FIGS. 2-9 are schematic line drawings of the protective case to illustrate various views and features of the case. Cluster of cutouts, such as 201 in FIGS. 2 and 801 in FIG. 8, are positioned around corners of the first and second protective rims 101 and 107. The spatial arrangements of a plurality of cutouts are structured to dissipate physical force generated by impacts, particularly around corners, where they are the most vulnerable. Design elements such as 503 and 505 in FIG. 5 along sides of the first protective rim 101 comprise a slight difference in thickness as well as in texture. They facilitate griping of the case and the device during handling. Various gaps and openings can be customized to accommodate input and output requirements around the encased device. FIGS. 6 and 7 illustrate side views of opened areas 604 and 706 to accommodate an assortment of hardware and accessories.

FIG. 8 illustrates a bottom view of a device fitted with the second shell layer 105 and second protective rim 107. The second protective rim 107 further comprises a plurality of feet 802 so that the device is slightly raised above a surface it rests on. Profiles of the feet, 602 and 702, can be viewed in FIGS. 6 and 7. The second shell layer 107 also comprises series or groups of slit openings 804 and 806 to facilitate heat dissipation. Exemplary appearance of 804 and 806 can be easily tailored as desired, so long as they adequately serve their functional purpose.

Laptops or handheld tablets and phones typically have battery compartments, which generate a fair amount of heat during operation. While completely covering the device may protect the device from forceful impact or scratches, it increases the overall weight of the device and hinders dissipation of heat. Chronic over heating of the device itself can cause internal damage or even fire. In the present disclosure, various exemplary features, as designed and described above, strive to achieve a balance to accommodate both physical protection and heat dissipation, without adding too much extra weight when fitted onto the device.

FIGS. 12 and 13 disclose variations of the present disclosure for cases to protect a foldable tablet 120 and a smart phone 130. Although length and width of each layer are modified accordingly (1201, 1203, 1205, 1207, 1301, 1303, 1305, and 1307), main features as described above are similar or identical in nature. First protective rim and first shell layer do not need to be connected to the second protective rim and second shell layer along the fold (or hinge region) of the device. They are, however, connected via a latch mechanism in the front where the device opens and closes.

Figure 14:
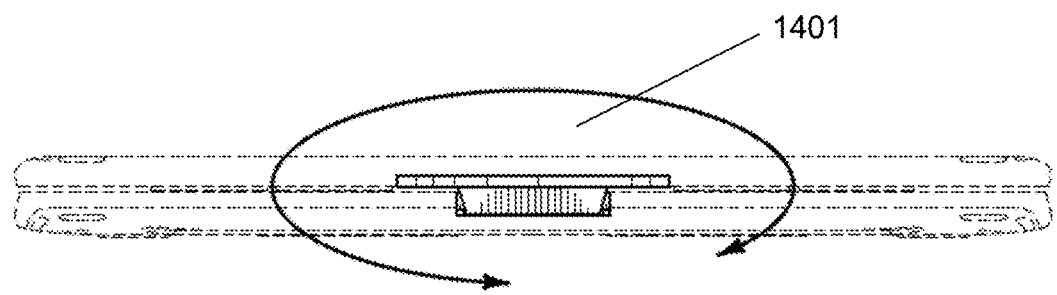
FIG. 14 is frontal view of a latch portion of the case.
Figure 15:
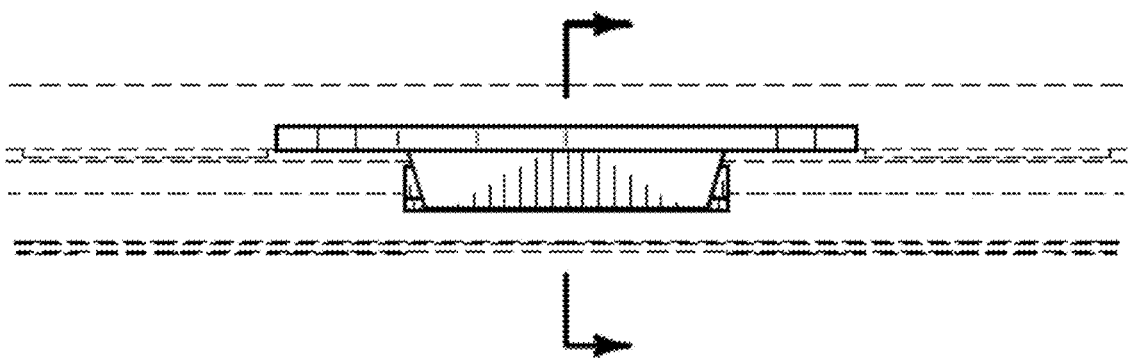
FIG. 15 is an enlarged frontal view of a latch as encircled in FIG. 14.
Figure 16:
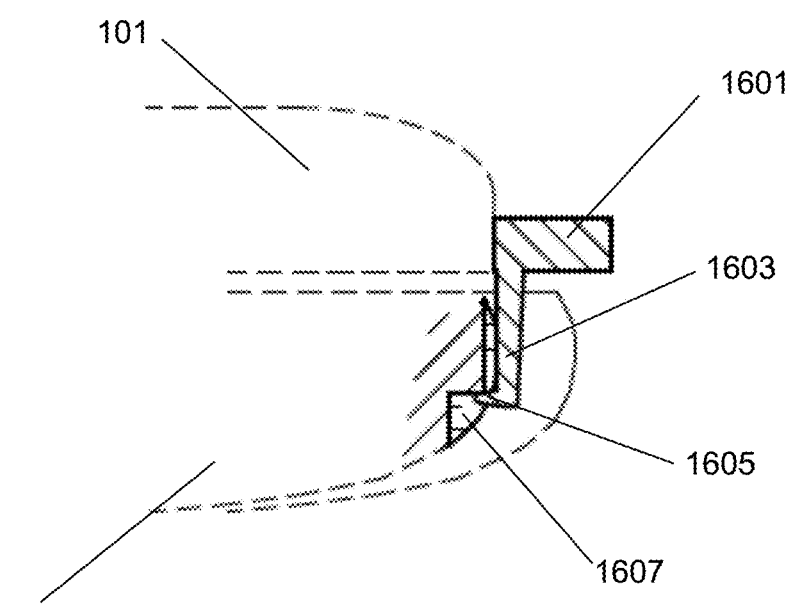
FIG. 16 is a sagittal view of the latch if it were sectioned along an axis marked between two arrows in FIG. 15.
Figure 17:
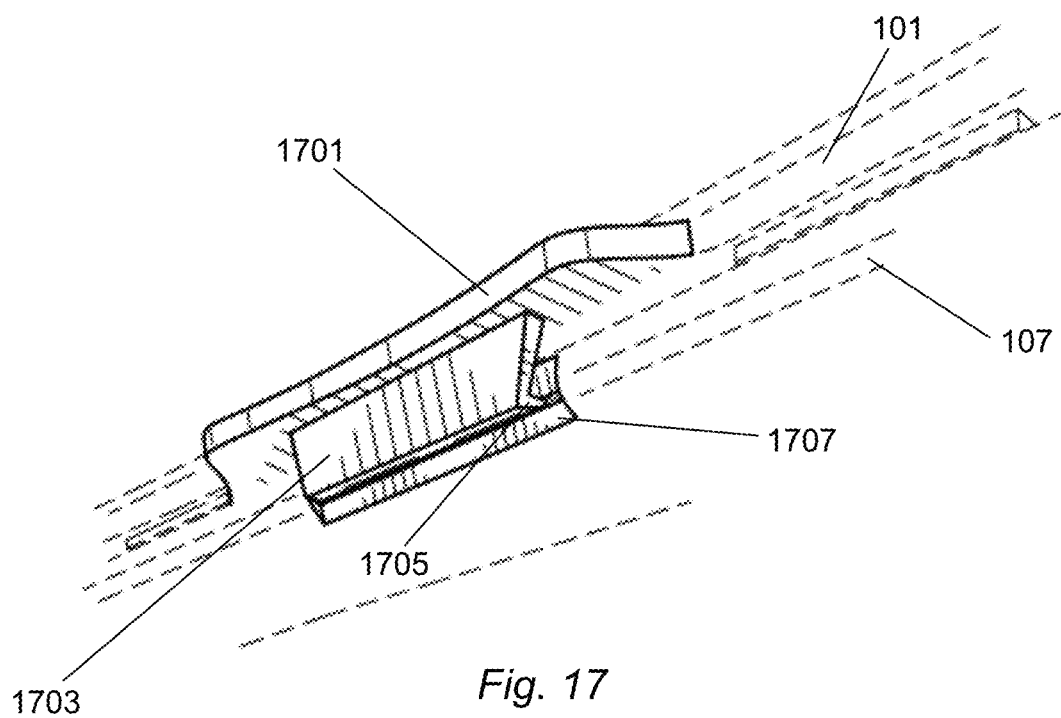
FIG. 17 is a perspective view of a latch in a secured position, in line drawing.
Figure 18:
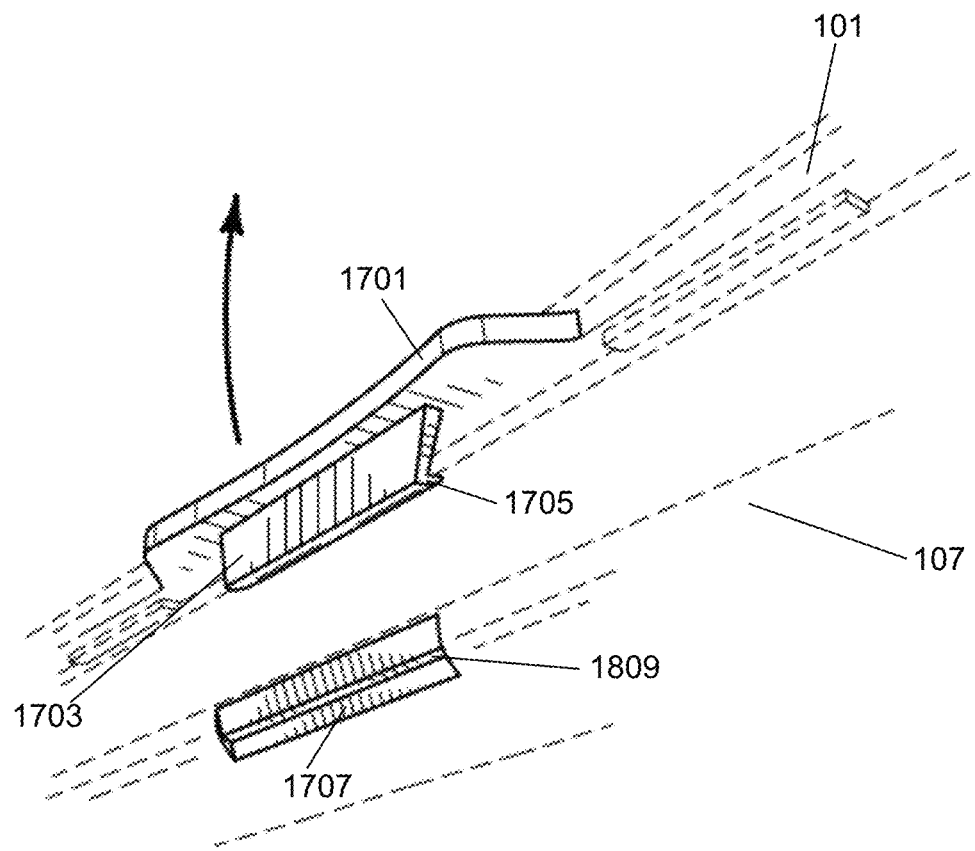
FIG. 18 is a perspective view of the latch in an opened position, in line drawing.

FIGS. 14-18 illustrate a detailed latch mechanism that secures and releases the protected device in a closed or opened state. A frontal view of the latch mechanism 1401 is enlarged in FIG. 15. The latch mechanism 1401 can be shifted either to the left or to the right along the front surface of the first and second protective rims 101 and 107, deviating laterally from the center position as illustrated in FIG. 14. A sagittal plane view of the latch along arrow marks in FIG. 15 is further elaborated in FIG. 16. The latch mechanism mainly comprises a flat lip 1601, a latch body 1603, a footed end 1605, and a receiving slot 1607.

The flat lip 1601, with a preset and uniform thickness, extends out of the front edge of the first protective rim 101, and is substantially parallel to the top surface of the device. A latch body 1603 is affixed to the inferior surface of the flat lip 1601 and extends downward (allow for a range of +/−10 degrees from 90 degrees down). The latch body 1603, as viewed from the side, comprises a hook profile with a footed end 1605. A receiving slot 1607 resides along the outer surface of the second protective rim 107, with a profile of a step inward indentation, and a dimension that is comparable to the width and depth of the footed end 1605. When the device fitted with the protective case is in a fully closed position, the footed end 1605 from the first protective rim 101 is snapped into the receiving slot 1607 of the second protective rim 107, and held via friction in some exemplary embodiments. Perspective views of the latch mechanism in a closed and an opened position are further illustrated in FIGS. 17 and 18, with a corresponding flat lip 1701, a latch body 1703, a footed end 1705, and a receiving slot 1707. In an opened position in FIG. 18, the receiving slot 1707 further comprises a receiving slit 1809 in another exemplary embodiment. The foot end can be inserted in to and out of the receiving slit 1809 accordingly.

Figure 19:
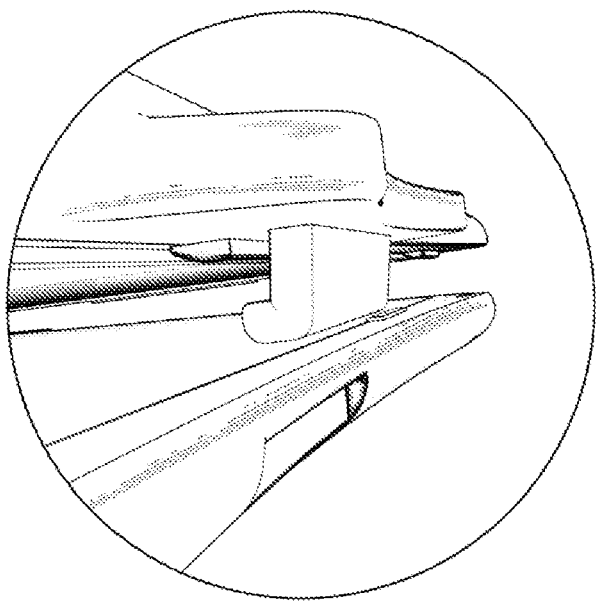
FIG. 19 is a simulated view of the latch in an opened position.
Figure 20:
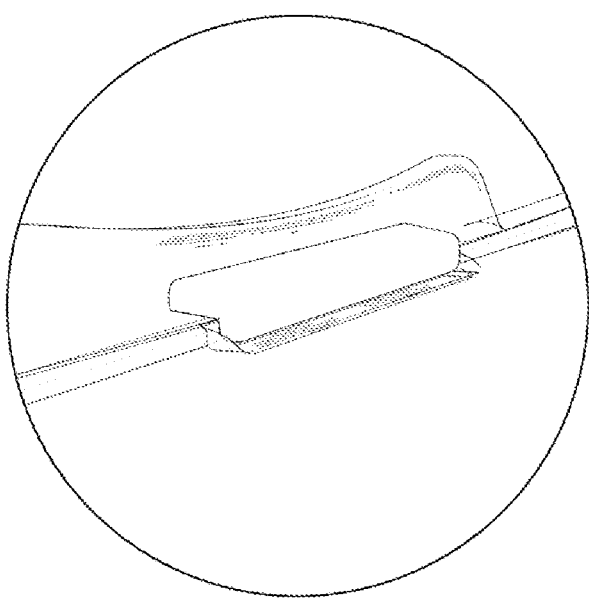
FIG. 20 is a simulated view of the latch in a secured position.

FIGS. 19-21 illustrate exemplary variations of the latch mechanism in shape and in dimension. Generally speaking, the flat lip region exceeds the latch body both in width and in depth by a preset amount. The space between the flat lip and all around the latch body should be adequate enough for a finger to grip and to pry with some force. The latch body and its footed end are manufactured to be stiff enough to secure two portions of a device in a locked position, yet flexible enough to tolerate some bending as it snaps in and out of the receiving slot.

Protective cases are usually made of materials that are strong, light, and somewhat flexible. Materials suitable for the present disclosure may include, but not limited to Thermoplastic Urethanes (TPU) and Thermoplastic Elastomer (TPE), which are know for resisting wear and fading, and are relatively light in weight. A mixture of Acrylonitrile Butadiene Styrene (ABS) plastic and Polycarbonate (PC) can also be used. TPU, TPS, and Silicon can also be used to provide shock resistance, since they are slightly softer.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus the breadth and scope of the present disclosure should not be limited by any of the above-described exemplary embodiments.

Terms and phrases used in this document, and variations thereof, unless otherwise expressly stated, should be construed as open United as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A protective case for a computing device, comprising:
   a first protective rim configured to enclose and to capture at least a portion of a first body and its perimeter of the computing device, wherein the first protective rim further encloses a first shell layer covering a top surface of the first body;
   a second protective rim configured to enclose and to capture at least a portion of a second body and its perimeter of the computing device, wherein the second protective rim further encloses a second shell layer covering a bottom surface of the second body; and
   a latch mechanism comprising a flat lip, extending directly outward from a front edge of the first protective rim, and a latch body with a footed end affixed to an inferior surface of the flat lip extending downward, wherein a tip portion of the footed end is snapped in to or out of a receiving slot situated at a corresponding location along the second protective rim.

2. The protective case for a computing device of claim 1, wherein all corners of the first and second protective rims further comprise groups of cutouts in a preset formation.

3. The protective case for a computing device of claim 1, wherein the second protective rim further comprises foot elements to raise the computing device above its resting surface.

4. The protective case for a computing device of claim 1, wherein the second shell layer and the second protective rim further comprises groups of slits to facilitate heat dissipation.

5. The protective case for a computing device of claim 1, wherein the second protective rim further comprises opened spaces along its sides to accommodate hardware and accessories.

6. The protective case for a computing device of claim 1, wherein the flat lip of the latch mechanism is substantially parallel to a top surface of the computing device.

7. The protective case for a computing device of claim 1, wherein the flat lip of the latch mechanism comprises a width and depth greater than that of the latch body by a preset amount.

8. The protective case for a computing device of claim 1, wherein the latch body and its footed end of the latch mechanism comprise a hook shaped profile.

9. The protective case for a computing device of claim 1, wherein the flat lip of the latch mechanism is generally perpendicular to the latch body.

10. The protective case for a computing device of claim 1, wherein the receiving slot of the latch mechanism further comprises a receiving slit with a width equal to or longer than that of a width of the footed end.

11. The protective case for a computing device of claim 1, wherein the first and second shell layer comprises a preset transparency value anywhere between completely transparent to completely opaque.

* * * * *